United States Patent [19]

Hiele

[11] 3,891,815

[45] June 24, 1975

[54] PRINTED CIRCUIT BOARD FOR A SWITCHING NETWORK

[75] Inventor: Adrianus Leonardus Hiele, Hilversum, Netherlands

[73] Assignee: U.S. Philips Corporation, New York, N.Y.

[22] Filed: Apr. 17, 1973

[21] Appl. No.: 351,823

[30] Foreign Application Priority Data

Apr. 27, 1972 Netherlands ........................ 7205680

[52] U.S. Cl. .......... 200/175; 317/101 CE; 335/152; 340/166 S

[51] Int. Cl. ............................................ H01h 3/02

[58] Field of Search .................... 335/152; 174/68.5; 200/175; 317/101 CE; 340/166 S

[56] References Cited

UNITED STATES PATENTS

| | | | |
|---|---|---|---|
| 2,066,511 | 1/1937 | Arlt | 174/68.5 |
| 3,188,423 | 6/1965 | Glenner et al. | 335/152 |
| 3,496,555 | 2/1970 | Jones et al. | 340/174 R |

*Primary Examiner*—David Smith, Jr.
*Attorney, Agent, or Firm*—Frank R. Trifari; George B. Berka

[57] ABSTRACT

A disconnectable cross-point for the phase reversal of a signal in a pair of conductive tracks printed on one surface of a supporting board and connected to terminals of a multicontact switching device, is carried out by means of contacts of the switching device.

2 Claims, 2 Drawing Figures

PRINTED CIRCUIT BOARD FOR A SWITCHING NETWORK

The invention relates to a printed circuit board for a switching network, comprising switching members and two pairs of printed tracks which comprise cross-points so as to reduce cross-talk between the pairs of printed tracks.

Printed circuit boards are generally used. U.S. Pat. No. 3,496,555 describes a magnetic memory apparatus comprising a printed circuit board in which a drive winding is formed by a first pair of printed tracks and a sense winding is formed by a second pair of printed tracks. So as to eliminate cross-talk between the drive winding and the sense winding, the sense winding is provided with a crosspoint which divides the sense winding into two equally large loops which are coupled to the sense winding in an opposite sense with respect to each other. Consequently, the cross-talk signals induced in the two loops are equally large but have opposite polarity, so that they cancel. The crosspoint is realized by means of two additional interconnections.

A printed circuit board for a switching network comprises switching members which are inserted in the printed tracks. A problem exists in that other parts of the printed tracks are included or are not included in a signal path, depending on whether each of the switching members is in the active or in the rest state, so that cross-talk reduction must be effected for a signal path which has a variable location on the printed circuit board and hence a variable length.

The invention has for its object to realize this cross-talk reduction in a very simple manner with a minimum number of additional interconnections.

The device according to the invention is characterized in that crosspoints are realized by means of switching members.

The invention and its advantages will be described in detail hereinafter with reference to the figures.

FIG. 1 shows a printed circuit board 25 accommodating that part of the wiring for a switching network comprising eight switching members which is of importance to the invention. This wiring is provided in the form of printed tracks, both on the upper surface (represented by solid lines) and on the lower surface (represented by broken lines).

The printed tracks provided on the upper surface are connected to the printed tracks provided on the lower surface by means of interconnections in the form of plated-through holes (denoted by dots).

Figure 1:
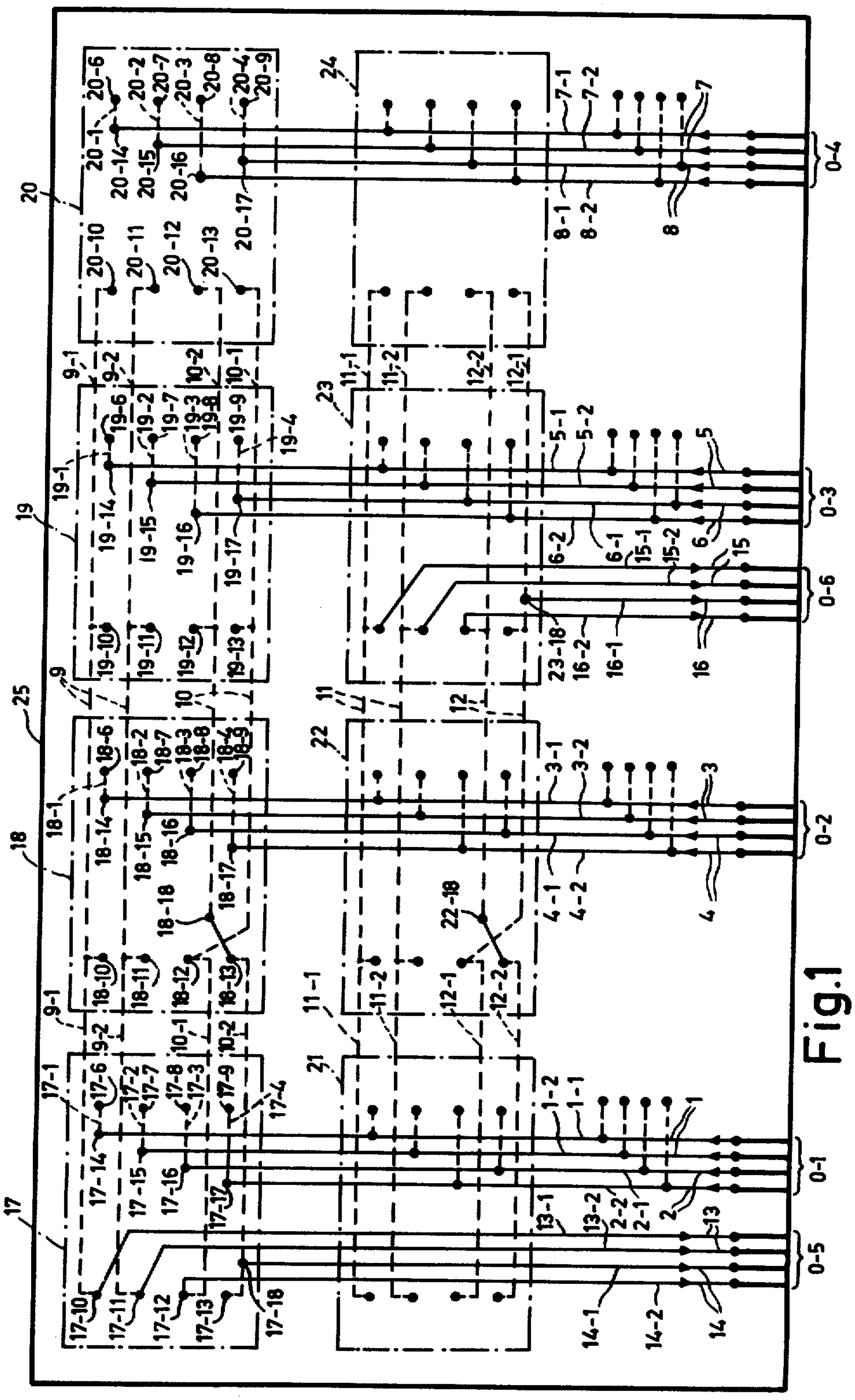
FIG. 1 shows an embodiment of a printed circuit board according to the invention.
Figure 2:
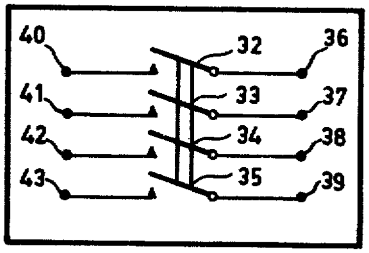
FIG. 2 shows a switching member as used in the embodiment of FIG. 1.

For the sake of simplicity of FIG. 1, the switching member are not shown in this figure; a switching member is separately shown in FIG. 2. These switching members, for example, reed relays, comprise four contacts 32 to 35. These contacts are closed in the active state, thus interconnecting the connection terminals 36 to 39 with the connection terminals 40 to 43.

Stroke-dot lines in FIG. 1 denote the locations 17 to 24 where the eight switching members are to be provided. Per location eight interconnections are provided to which the connection terminals of the switching members are conductively connected. For example, at the location 17 the interconnections 17–6 to 17–13 are provided, which are connected to the connection terminals 36 to 43 of a switching member which is not shown.

Also provided on the printed circuit board are four groups 0.1 to 0.4 of four input terminals each, and two groups 0–5, 0–6 of four output terminals each. So as to enable random connection of each group of input terminals 0–1, 0–2, 0–3 or 0–4 to each group of output terminals 0–5 or 0–6, the locations 17 to 24 in which the switching members are provided are divided into two rows, each row comprising four locations 17 to 20 and 21 to 24, respectively. On the one side, the switching members of the locations 17 and 21, 18 and 22, 19 and 23, 20 and 24 are connected in pairs to the input terminal groups 0–1, 0–2, 0–3 and 0–4, respectively, via two pairs of conductors 1 and 2, 3 and 4, 5 and 6, 7 and 8, respectively, each of which comprises two printed tracks 1–1, 1–2 and 2–1, 2–2; 3–1, 3–2 and 4–1, 4–2; 5–1, 5–2 and 6–1, 6–2; 7–1, 7–2 and 8–1, 8–2, respectively. On the other side, the switching members of the locations 17 to 20 and 21 to 24 are connected per row, via two pairs of conductors 9 and 10 and 11 and 12, respectively, each comprising two printed tracks 9–1, 9–2 and 10–1, 10–2, and 11–1, 11–2 and 12–1, 12–2, respectively, to two pairs of conductors 13 and 14, and 15 and 16, respectively, each of which comprises two printed tracks 13–1, 13–2 and 14–1, 14–2 and 15–1, 15–2 and 16–1, 16–2, respectively. These pairs of conductors 13 and 14, and 15 and 16 are connected to the output terminal group 0–5 and 0–6, respectively.

As appears from FIG. 1, the pairs of conductors 1, 3, 5, 7, 9, 11, 13 and 15 extend parallel to and at a short distance from the pairs of conductors 2, 4, 6, 8, 10, 12, 14 and 16. A current flowing in the odd pairs of conductors incorporated in a signal path between one of the groups of input terminals 0–1, 0–2, 0–3 or 0–4 and one of the groups of output terminals 0–5, 0–6 induces a voltage in the adjacently arranged even pairs of conductors, and vice versa. These undesired induced voltages are referred to as cross-talk signals. So as to suppress this cross-talk, it is known to provide a crosspoint in one pair of conductors by means of two additional interconnections about halfway the signal path. The cross-talk signals induced in the conductor pairs in one half of the signal path are then in phase-opposition with and approximately as large as the cross-talk signals induced in the conductor pairs of the other half of the signal path, so that these cross-talk signals eliminate each other. In a printed circuit board 1 for a switching network as shown in FIG. 1, a problem arises because the fact whether or not the switching members which are provided in the locations 17 to 24 are closed determines which pairs are included in a signal path and which pairs are not included. As a result, the location of the signal path, and hence the length of the signal path, is different each time.

As is shown in FIG. 1, crosspoints are realized according to the invention by means of switching members so as to enable a simple suppression of cross-talk signals in any signal path which can be established by means of the switching members. To this end, the printed tracks 1–1, 1–2, and 2–1, 2—2 are connected, at the location 17 via the interconnections 17–14 to 17—17 and the printed tracks 17–1 to 17–4, to the interconnections 17–6 to 17–9, and the printed tracks 13–1, 13–2 are connected to the interconnections 17–10, 17–11, whilst the printed track 14–1 is connected, via an additionally provided interconnection 17–18 and the printed tracks 10–2, to the interconnection 17–13, the printed track 14–2 being directly connected to the interconnection 17–12. It is thus achieved that, when the switching member provided in the location 17 is in the active state, the conductor pair 2 is cross-wise connected to the conductor pair 14, at the location 17, and the conductor pair 1 is connected without crossing to the conductor pair 13. The pairs of conductors 1 and 2 have the same length as the pairs of conductors 13 and 14, so that the cross-talk signals in the four-wire signal path which is established between the input terminals 0–1 and the output terminals 0–5 as a result of the active state of the switching member provided in location 17, fully eliminate each other.

Furthermore, at the location 18 the printed tracks 3–1, 3–2 and 4–1, 4–2 are connected, via the interconnections 18–14 to 18–17 and the printed tracks 18–1 to 18–4, to the interconnections 18–6 to 18–9, and the interconnections 18–10 to 18–13 are connected, via the printed tracks 9–1, 9–2 and 10–1, 10–2, to the interconnections 17–10 to 17–13. It is thus achieved that, when the switching member which is provided in the location 18 is in the active state, a four-wire signal path is established between the input terminals 0–2 and the output terminals 0–5, the conductor pair 3 being connected without crossing at the location 17, via the conductor pair 9, to the conductor pair 13, the conductor pair 4 being cross-wise connected, via the conductor pair 10, to the pair of conductors 14. The length of the pairs of conductors 3 and 4 is the same as that of the pairs of conductors 13 and 14, so that the cross-talk signals induced in these conductor pairs eliminate each other. However, no cross-talk compensation is effected for the part of the signal path which is formed by the parts of the conductor pairs 9 and 10 which are situated between the locations 17 and 18. In order to keep the cross-talk in this comparatively small part of the signal path as small as possible, the printed tracks 9–1, 9–2 are provideed at a comparatively large distance from the printed tracks 10–1, 10–2.

Furthermore, at the location 19 the printed tracks 5–1, 5–2 are connected to the interconnections 19–6, 19–7 via the interconnections 19–14, 19–15 and the printed tracks 19–1, 19–2, and the printed track 6–1 is connected, via the interconnection 19–17 and the printed track 19–4, to the interconnection 19–9, the printed track 6–2 being connected, via the interconnection 19–16 and the printed track 19–3, to the interconnection 19–18. Moreover, at the location 18 a crosspoint is provided by means of only one additional interconnection 18—18, and the printed track 10–2 is led, via the interconnection 18–13, to the upper surface where it crosses the printed track 19–1 which is situated on the lower surface, and is subsequently returned to the lower surface via the interconnection 18—18. It is thus achieved that the interconnections 19–12 and 19–13 are connected, via the printed tracks 10–2 and 10–1, to the interconnections 17–13 and 17–12, whilst the printed tracks 9–1 and 9–2 are connected to the interconnections 17–10 and 17–11.

When the switching member which is provided in the location 19 is in the active state, a four-wire signal path exists between the input terminals 0–3 and the output terminals 0–6, the conductor pair 5 being cross-wise connected in the location 17, via the conductor pair 9, to the conductor pair 13, the conductor pair 6 being cross-wise connected at the location 19 to the conductor pair 10 which is provided with a crosspoint at the location 18 and which is connected without crossing to the conductor pair 14. On the one side, the conductor pair 5 of the signal path is thus coupled to the conductor pair 6 in the same manner as the parts of the conductor pairs 9 and 10 which are situated between the locations 17 and 18 are coupled to each other, but on the other side they are coupled to conductor pair 6 in a way opposite to that in which the conductor pairs 13 and 14 are coupled to each other, and in which the parts of the conductor pairs 9 and 10 which are situated between the locations 18 and 19 are coupled to each other. Because, as is shown in FIG. 1, the length of the parts of the pairs of conductors 9 and 10 which are situated between the locations 17 and 18 is approximately equal to the length of these pairs of conductors between the locations 18 and 19, and because the length of the pairs of conductors 5 and 6 is equal to the length of the pairs of conductors 13 and 14, the cross-talk signals induced in the four-wire signal path eliminate each other completely.

In the same way as in which at the location 19 the pairs of printed tracks 5–1, 5–2 and 6–1, 6–2 are connected to the interconnections 19–6 to 19–9 and the interconnections 19–10 to 19–13 are connected to the printed tracks 9–1, 9–2 and 10–2, 10–1, the pairs of printed tracks 7–1, 7–2 and 8–1, 8–2 are connected at the location 20 to the interconnections 20–6 to 20–9, and the interconnections 20–10 to 20–13 are connected to the printed tracks 9–1, 9–2 and 10–2, 10–1. When the switching member which is provided in the location 20 is in the active state, a four-wire signal path is thus established between the input terminals 0–4 and the output terminals 0–5 in which the induced cross-talk signals eliminate each other in a manner which is identical to the described manner, with the exception of the parts of the conductor pairs 9 and 10 which are situated between the locations 19 and 20. For the part of the core pairs 9 and 10 in which the induced cross-talk signals are not eliminated, it applies again that these parts have only a limited length and that the printed pairs of tracks 9–1, 9–2 and 10–1, 10–2 are situated at a comparatively large distance from each other. It follows that a part of a printed track which is not compensated for cross-talk always constitutes a small part of the overall print length of a signal path, the said length never being larger than the distance between two adjacent switching members, and the said part always being situated in printed tracks which are only very weakly coupled to each other, with the result that these cross-talk signals are negligibly small.

The pairs of conductors 1 to 4 was coupled to the switching members which are provided in the locations 21 and 22 in the same manner as the pairs of conductors 5 to 8 are coupled to the switching members provided in the locations 19 and 20, and the pairs of conductors 5 to 8 are connected to the switching members provided in the locations 23 and 24 in the same way as the pairs of conductors 1 to 4 are connected to the switching members provided in the locations 17 and 18. The switching members which are provided in the locations 21 to 24 are interconnected, via the pairs of conductors 11 and 12, in the same manner as the switching members provided in the locations 17 to 20 are interconnected by means of the pairs of conductors 9 and 10, the conductor pair 12 being provided with a crosspoint at the location 22 by means of an additional interconnection 22–18. At the location 23, the conductor pairs 15 and 16 which are connected to the output terminal group 0–6 are connected to the conductor pairs 11 and 12, notably the printed track 16–1 being connected to the printed track 12–1 by means of the additionally provided interconnection 23–18. As a result of this method of connecting the conductor pairs 1 to 8 and 11, 12 15 and 16 to the switching members provided in the locations 21 to 24 it is achieved, when one of these switching members is set to the active state, that a four-wire signal path is closed, between the input terminal group connected to this switching member and the output terminal group 0–6, in which induced cross-talk signals eliminate each other.

It is to be noted that a substantial reduction of the number of interconnections can be achieved by using two kinds of switching members, the connection terminals 36 to 39 thereof then being situated, instead of their situation in the switching member as shown in FIG. 2, for a first kind of switching member, for example, like the interconnections 17–14 to 17—17, and for a second kind of switching member, for example, like the interconnections 20–14 to 20–17.

What is claimed is:

1. A circuit arrangement for switching network comprising: a supporting board; a plurality of groups of pairs of upper conductive tracks disposed on one surface of the board and extending substantially parallel to one another; input terminals connected to assigned groups of said upper conductive tracks, and output terminals connected to at least one remaining group; a plurality of multicontact switching means disposed on said one surface of the board and each having connection terminals for respective switching contacts; a plurality of interconnections passing through the board and arranged to form a first pattern for accommodating said connection terminals and a second pattern connected to respective upper conductive tracks in consecutive order to face corresponding interconnections of said first pattern; a plurality of lower conductive tracks disposed on the opposite surface of the board and connected between said interconnections for providing, together with said switching means, optional signal paths between said input and output terminals; two interconnections in said second pattern pertaining to a pair of tracks for a switching means having reversed order with respect to the order of interconnections on the adjacent pair of tracks in a group, for providing, by means of contacts of said switching means, a disconnectable cross-point between the conductive tracks for a selected signal path, and further comprising an additional interconnection passing through the board near a side of a track assigned to another switching means and being connected to a corresponding interconnection in said first pattern by a lower conductive track to form a permanent cross-point.

2. A circuit arrangement according to claim 1, wherein said conductive tracks are printed on said board.

* * * * *